(12) United States Patent
Tzou

(10) Patent No.: US 7,745,515 B2
(45) Date of Patent: Jun. 29, 2010

(54) COMPOSITION OF DIHYDROBENZOXAZINE RESIN, EPOXY RESIN(S), NOVOLAC RESIN AND CURING PROMOTER

(75) Inventor: Ming-Jen Tzou, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 373 days.

(21) Appl. No.: 11/633,481

(22) Filed: Dec. 5, 2006

(65) Prior Publication Data

US 2008/0132629 A1 Jun. 5, 2008

(51) Int. Cl.
*C08K 3/22* (2006.01)
*C08K 3/36* (2006.01)
*C08L 63/02* (2006.01)
*C08L 63/04* (2006.01)

(52) U.S. Cl. .................. 523/428; 523/427; 523/429; 525/486; 525/488; 525/489; 525/490; 525/526

(58) Field of Classification Search .................. None
See application file for complete search history.

(56) References Cited

U.S. PATENT DOCUMENTS

| | | | | |
|---|---|---|---|---|
| 5,443,911 A | * | 8/1995 | Schreiber et al. | 428/413 |
| 6,291,627 B1 | * | 9/2001 | Wang et al. | 528/99 |
| 6,900,269 B2 | * | 5/2005 | Hwang et al. | 525/109 |
| 2004/0076805 A1 | * | 4/2004 | Oohori et al. | 428/209 |
| 2007/0191555 A1 | * | 8/2007 | Ishida et al. | 525/523 |

FOREIGN PATENT DOCUMENTS

| | | | |
|---|---|---|---|
| JP | 11-140278 A | * | 5/1999 |
| JP | 2000-248151 A | * | 9/2000 |
| JP | 2003-55436 A | * | 2/2003 |

OTHER PUBLICATIONS

NPEL 128 epoxy resin, N.R. Chemicals Pvt. Ltd. product data sheet, Mumbai, India, 2009, one page.*
Nan Ya Epoxy Resin, Nan Ya Plastics Corporation, Taipei, Taiwan, Sep. 2007, 20 pages.*
Na Ya Plastics Corporation, "Nan Ya Epoxy Resin," NPEP 200LA70 phosphorus type epoxy resin, 2007, three pages.*

* cited by examiner

*Primary Examiner*—Robert Sellers
(74) *Attorney, Agent, or Firm*—Ming Chow; Sinorica, LLC

(57) ABSTRACT

The present invention relates to an epoxy resin varnish composition with high glass transition temperature for laminate plate, wherein the resin composition comprises: (A) a new dihydrobenzoxazine thermosetting resin obtained by reacting compounds: (a) phenolic products from reaction of di- or multifunctional epoxy resin and di-functional phenolic compounds; (b) mono- or di-functional primary amines; (c) di-functional phenols; and (d) formaldehyde or paraformaldehyde, (B) one or more epoxy resins, (C) novolac resin curing agents, and (D) curing promoters. For the epoxy resin varnish composition, crosslinking density of resin is increased due to using modified dihydrobenzoxazine thermosetting resin with multiple functional groups, so that mechanical strength and heat resistance of the obtained substrate are remarkably improved, and solubility problem of dihydrobenzoxazine in solvent is solved to greatly elevate production efficiency. The epoxy resin varnish composition according to the present invention, which is useful as high performance electronic materials, is of high glass transition temperature (Tg), low water absorption and excellent heat resistance, and is qualified for UL94 V-0 Flammability Test.

18 Claims, No Drawings

COMPOSITION OF DIHYDROBENZOXAZINE RESIN, EPOXY RESIN(S), NOVOLAC RESIN AND CURING PROMOTER

FIELD OF THE INVENTION

The present invention relates to an epoxy resin varnish composition with high glass transition temperature for laminate plate, which is of good reactivity and wide working window in the manufacturing process. It shows good working ability, and the substrate made therefrom is of high glass transition temperature (Tg), low water absorption and excellent heat resistance, and are qualified for UL94 V-0 Flammability Test. Fire retardant requirement is fulfilled by effectively reducing usage of phosphorus or bromine and the cost is decreased thereby.

DESCRIPTION OF THE RELATED PRIOR ART

Epoxy resin is of good reactivity, toughness and softness due to its chemical structure, as well as good mechanical and electric properties and dimension stability; it also shows excellent adherence on various substrates. Cured epoxy resin retains its original characteristics, especially for blocking vapor and chemical substances, and has the advantages of lightweight and low-cost. Therefore, epoxy resin is widely used in the fields of electronics and aerospace, particularly used as semiconductor packaging materials and printed circuit board substrates. As the development of printed circuit boards is toward light, thin and more precious in recent years, there is still a need for improving qualities of these materials.

SUMMARY OF THE INVENTION

It is necessary for laminate plate, usable in printed circuit to be lead-free according to the international regulation due to the trend of environmental protection, so that the working ability of the obtained substrate is strictly regulated. Particularly, issues involving glass transition temperature (Tg) of materials and heat resistance of substrate in solder furnace are required to be solved by those who are in this field.

Accordingly, the present inventor has conducted extensively study and found that the above required properties can be obtained by epoxy resin varnish admixing a new dihydrobenzoxazine (NPBX) thermosetting resin with proper reactivity, wide working window, high glass transition temperature, excellent heat resistance, low water absorption and good electronic properties. Dihydrobenzoxazine thermosetting resin is of good heat resistance, high Tg and fire retardance by containing benzene ring and nitrogen in its chemical structure. Further, with steric hindrance by adequate number of epoxy functional groups and benzene rings. The proper reactivity and higher resin molten viscosity are obtained, thus working window is wide and the operations are excellent. Also, as NPBX thermosetting resin is a nitrogen-containing heterocyclic compound with minor amount of phosphorus introduced thereto, better resinous materials for fire retardant laminate plate are obtained from synergistic effect of combining phosphorus and nitrogen.

Therefore, an object of the present invention is to provide an epoxy resin varnish composition with high glass transition temperature for laminate plate, wherein the resin composition comprises: (A) a new dihydrobenzoxazine (NPBX) thermosetting resin obtained by reacting the following compounds: (a) phenolic products from the reaction of di- or multifunctional epoxy resin and di-functional phenolic compound; (b) mono- or di-functional primary amines; (c) di-functional phenols; and (d) formaldehyde or paraformaldehyde, (B) one or more epoxy resins, (C) novolac resin curing agents, and (D) curing promoters.

With the epoxy resin varnish composition, after cured, glass transition temperature (Tg) of the resultant materials is effectively elevated, water absorption of the obtained substrate is lowered, and heat resistance is improved. Therefore, it is cost-effective while having excellent working ability.

By admixing a new NPBX thermosetting resin, the epoxy resin varnish composition with high glass transition temperature for laminate plate according to the present invention is of better mechanical, chemical and physical properties like low hygroscopicity, high glass transition temperature, good dimension stability and electric properties, as compared with the general epoxy resin. It is ring-open polymerized by itself at higher temperature (230° C.) without adding promoter, and no volatile substance (by product) is produced during the ring-open polymerization so that the obtained substrate is not affected physically. However, curing reaction rate at high temperature is too fast to control. Therefore, if adequate phenols are added during curing, curing speed is moderated, curing temperature is lowered, and ring-open polymerization is promoted to completion, so that the obtained substrate is of better physical properties.

The NPBX thermosetting resin according to the present invention is described as prepared with aniline, bisphenol A and formaldehyde in U.S. Pat. No. 4,607,091, while utilizing novolac resin, aniline and formaldehyde in U.S. Pat. No. 6,005,064. However, the NPBX thermosetting resins made by the above patents are of poor solubility and is even saturated during storage at room temperature to cause that a large amount of crystals are precipitated out, so that it is inconvenient for subsequent use. To prevent from precipitating out, the present invention uses modified and synthesized NPBX resin, as its structure has been changed so that no large-amount precipitation occurs during storage, and which is useful for mass production industrially. Also, it is descried in U.S. Pat. No. 5,021,484 to achieve UL94 V-0 grade by directly curing at high temperature and adding Al(OH)$_3$ fire retardance; and U.S. Pat. No. 5,443,911 is to utilize benzoxazine, brominated epoxy resin and curing agent for reducing the usage of bromine, and after curing the resultant laminate plate achieves fire retardant grade. Additionally, it is described in ROC Patent No. 091125399 to utilize aromatic diamines, phenols, aniline, and aldehydes for producing NPBX thermosetting resin; however, it is expensive to use aromatic diamines and is not suitable for industrial uses.

DETAILED DESCRIPTION OF THE INVENTION

The present invention relates to an epoxy resin varnish composition comprising: (A) a new NPBX thermosetting resin, (B) one or more epoxy resins, (C) novolac resin curing agents, and (D) curing promoters. An NPBX thermosetting resin containing varnish composition for laminate plate is obtained by mixing (A), (B), (C), and (D) at specific ratio.

The component (A) with the following structure of a new NPBX thermosetting resin is obtained by reacting (a) phenolic products obtained from the reaction of di- or multifunctional epoxy resin and di-functional phenolic compounds; (b) mono- or di-functional primary amines; (c) di-functional phenols; and (d) formaldehyde or paraformaldehyde, in the presence of hydrocarbon solvents. Various types are provided through the modification as fully described in the following synthesis examples:

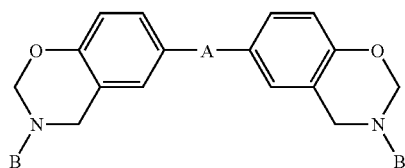

wherein A represents the following formula:

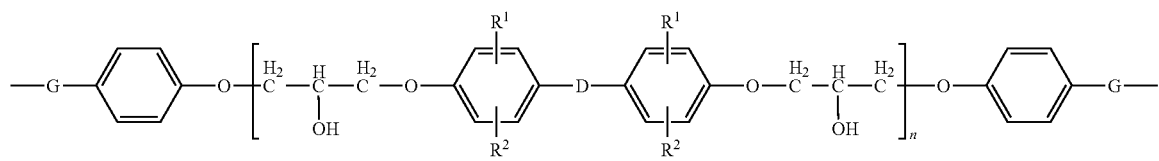

G represents

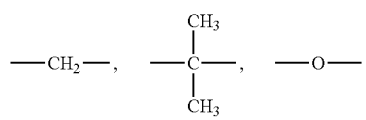

D represents

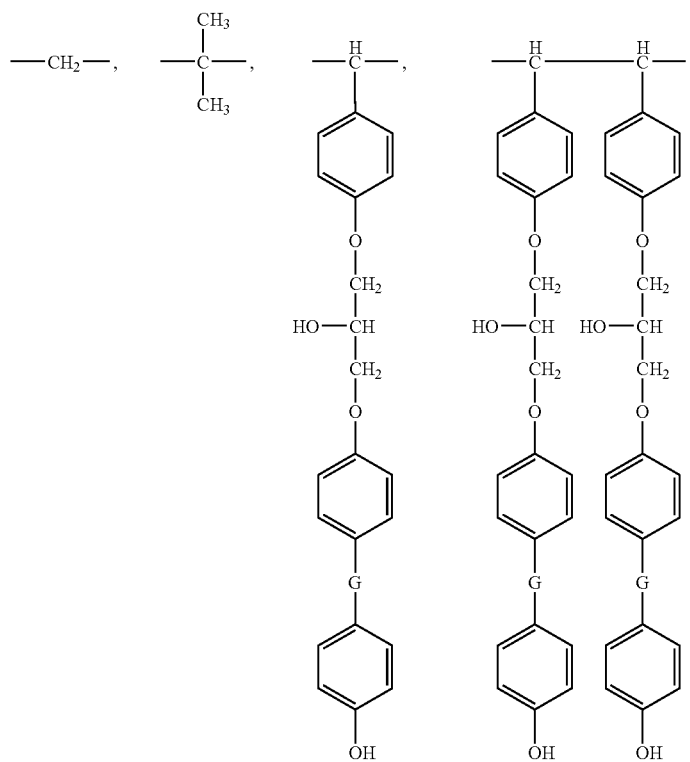

$R^1$ and $R^2$ each independently represents H, $CH_3$ or Br;

and B represents amines or diamines.

(A-1) NPBX-610 (80 solid % of modified NPBX) is obtained by charging 1710 g of bisphenol A (BPA), 558 g of liquid epoxy resin of NPEL-128E and quaternary phosphor salt catalyst into a 5 L 4-neck glass reactor fitted with heating jacket, temperature controller, electric stirrer and condenser, in the presence of small amount of solvents, and reacting at 150° C. for 2 hours; after cooling, adding 782 g of paraform- aldehyde and 1000 g of toluene to dissolve under stirring, and gradually dropping 1116 g of aniline into the above solution; reacting while keeping temperature at 60-110° C. for 4~6 hours, distilling solvents and non-reacted reactants under vacuum, and adding 900 g of acetone to dissolve them.

(A-2) NPBX-620 (80 solid % of modified NPBX) is obtained by charging 1710 g of BPA, 279 g of NPEL-128E and quaternary phosphor salt catalyst into a 5 L 4-neck glass reactor fitted with heating jacket, temperature controller, electric stirrer and condenser, in the presence of small amount of solvents, and reacting at 150° C. for 2 hours; after cooling, adding 880 g of paraformaldehyde, 148 g of diaminodiphe- nylmethane and 1000 g of toluene to dissolve under stirring, and gradually dropping 1116 g of aniline into the above solution; reacting while keeping temperature at 60-110° C. for 4~6 hours, distilling solvents and non-reacted reactants under vacuum, and adding 900 g of acetone to dissolve them.

(A-3) NPBX-630 (80 solid % of modified NPBX) is obtained by charging 1710 g of BPA, 600 g of tetrafunctional epoxy resin NPPN-431 and quaternary phosphor salt catalyst into a 5 L 4-neck glass reactor fitted with heating jacket, temperature controller, electric stirrer and condenser, in the presence of small amount of solvents, and reacting at 150° C. for 2 hours; after cooling, adding 782 g of paraformaldehyde and 1000 g of toluene to dissolve under stirring, and gradually dropping 1116 g of aniline into the above solution; reacting while keeping temperature at 60-110° C. for 4~6 hours, distilling solvents and non-reacted reactants under vacuum, and adding 900 g of acetone to dissolve them.

perature at 60-110° C. for 4~6 hours, distilling solvents and non-reacted reactants under vacuum, and adding 900 g of acetone to dissolve them.

In the synthesis examples A-1 to A-4, component (a) phenolic products are obtained by the reaction of di- or multi-functional epoxy resin and di-functional phenolic compounds for preparing NPBX. It is generally the phenolic products with the following formula from the reaction of liquid epoxy resin and BPA:

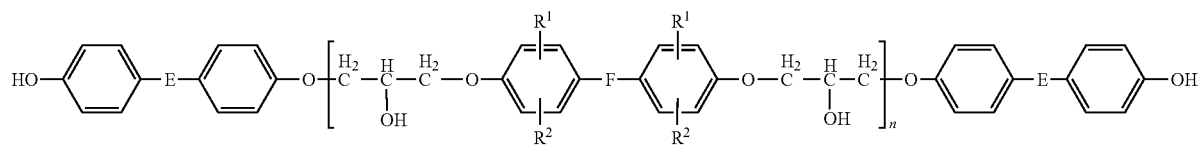

wherein F represents

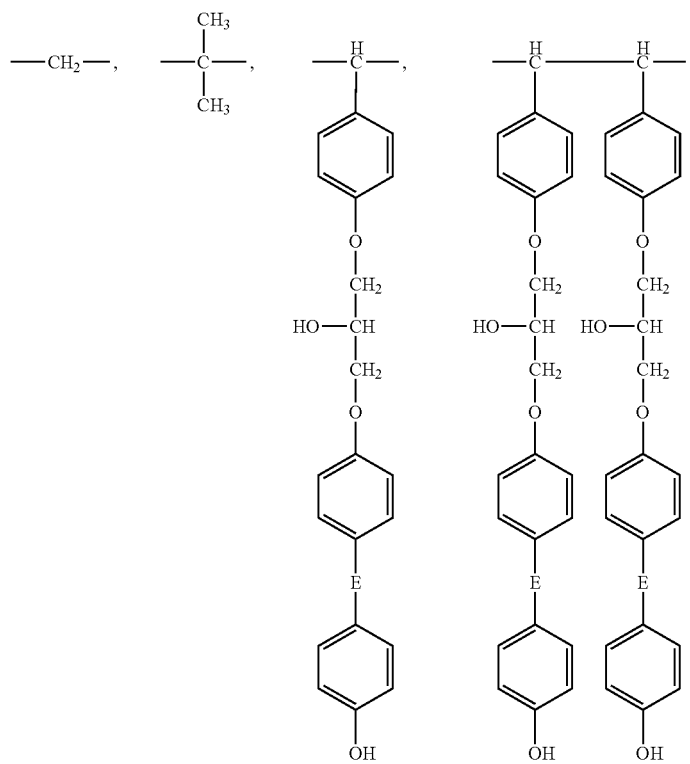

E represents

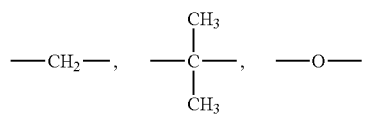

(A-4) NPBX-640 (80 solid % of modified NPBX) is obtained by charging 1710 g of BPA, 300 g of tetrafunctional epoxy resin NPPN-431 and quaternary phosphor salt catalyst into a 5 L 4-neck glass reactor fitted with heating jacket, temperature controller, electric stirrer and condenser, in the presence of small amount of solvents, and reacting at 150° C. for 2 hours; after cooling, adding 880 g of paraformaldehyde, 148 g of diaminodiphenylmethane and 1000 g of toluene to dissolve under stirring, and gradually dropping 1116 g of aniline into the above solution; reacting while keeping temand $R^3$ and $R^4$ each independently represents H, $CH_3$ or Br.

Component (b) mono- or di-functional primary amines for preparing NPBX is generally primary amines, at a content of 20~40 wt %, such as methylamine, aniline, toluidine, anisidine, etc., or aliphatic or aromatic amines, preferably aniline or diaminodiphenylmethane.

Component (c) di-functional phenols for preparing NPBX is at a content of 15~70 wt % and is generally o-cresol, bisphenol A, bisphenol F, bisphenol S, melamine, or novolac resin, preferably bisphenol or novolac resin.

Component (d) formaldehyde or paraformaldehyde for preparing NPBX is at a content of 10~30 wt % and is generally formaldehyde, paraformaldehyde or formaldehyde vapor, preferably formaldehyde as it dissolves slowly with addition of primary amine to promote the formation of NPBX.

Solvent for preparing NPBX is not particularly limited, as long as it is capable to dissolve various reactants. For example, it is selected from alcohols, ketones, ethers, esters, or hydrocarbons, preferably hydrocarbons such as toluene and xylene, since water is generated after polymerization, which is immiscible with toluene so that is able to reuse after reflux distillation.

As to epoxy resin in component (B) of the resin varnish composition according to the present invention, it can be phosphorus-containing epoxy resin obtained by 1) reacting organic phosphorus compounds (for example, 9,10-dihydro-9-oxa-10-phosphorphenanthrene-10-oxo compound (DOPO)) and o-cresol formaldehyde novolac epoxy (NPCN-703), in which epoxy equivalent is 350~480 g/eq with phosphorus content of 2~5 wt %, or 2) reacting organic phosphorus compounds (for example, 9,10-dihydro-9-oxa-10-phosphorphenanthrene-10-oxo compound (DOPO)) and phenol novolac epoxy, in which epoxy equivalent is 340~460 g/eq with phosphorus content of 2~5 wt %; or brominated epoxy resin obtained by reacting tetrabromobisphenol A (TBBA) and liquid epoxy resin (NPEL-128E) and admixing multifunctional epoxy resin, with bromine content being 14~21 wt %.

As to curing agent in component (C) of the resin varnish composition according to the present invention, it comprises novolac resin curing agents such as polyvalent amines, polyvalent carboxylic acids, dicyandiamides, anhydrides, phenol novolac epoxy (PN), melamine phenol novolac (MPN), BPA phenol novolac (BPA-PN), and tetraphenol ethane resin (TPN, manufactured by Nan Ya Plastics Corporation), preferably tetraphenol ethane resin.

As to curing promoter in component (D) of the resin varnish composition according to the present invention, it comprises tertiary phosphine, tertiary amine, quaternary phosphonium, quaternary ammonium, and imidazole, wherein tertiary phosphine comprises triphenylphosphine, and the like; tertiary amine comprises trimethyl aniline, triethyl amine, tributyl amine, dimethylamino ethanol, and the like; quaternary phosphonium comprises halo-containing quaternary phosphonium such as tetrabutyl phosphonium bromide, tetraphenyl phosphonium bromide, ethyl triphenyl phosphonium bromide, propyl triphenyl phosphonium bromide, butyl triphenyl phosphonium bromide, and the like; quaternary ammonium comprises halo-containing quaternary ammonium such as tetramethyl ammonium bromide, tetraethyl ammonium bromide, tetrabutyl ammonium bromide, triethyl benzyl ammonium bromide, triethyl phenethyl ammonium bromide, and the like; imidazole comprises 2-methyl imidazole, 2-ethyl imidazole, 2-dodecanyl imidazole, 2-phenyl imidazole, 4-methyl imidazole, 4-ethyl imidazole, 4-dodecanyl imidazole, 2-ethyl-4-methyl imidazole, 2-ethyl-4-hydroxymethyl imidazole, and the like, preferably 2-methyl imidazole or 2-ethyl-4-methyl imidazole. The promoter can be used singly or as mixture of two or more thereof. The usage is 0.01~1 PHR (parts per 100 parts) of total amount of resin, preferably 0.04~0.15 PHR based on total amount of resin.

An epoxy resin varnish composition with high glass transition temperature for laminate, according to the present invention, comprises: (A) 20~70 wt % of NPBX-610, 620, 630 or 640, (B) 30~70 wt % of phosphorus-containing epoxy resin (NPEP, with phosphorus content being 2~5 wt %) or bromine-containing epoxy resin (NPEB, with bromine content being 14~21 wt %), (C) 1~20 wt % of curing agent, and (D) curing promoter, with usage being 0.01~1 PHR based on total amount of resin. The composition may also comprise 5~30 wt % of the (C) novolac resin curing agent. It is possible to add inorganic fillers at 30~50 wt % (silica ($SiO_2$), aluminum hydroxide ($Al(OH)_3$), clay, titanium dioxide, barium titanate, and strontium titanate, etc.) or other modifiers (plasticizer, light stabilizer, thermal stabilizer, UV absorber, etc.), and add solvents for modifying viscosity of varnish such as organic aromatic solvents, protic solvents, keto solvents, ether solvents, and ester solvents, suitably toluene, N,N-dimethylformamide, acetone, methyl ethyl ketone, 1-methoxy-2-propanol, ethyl acetate, etc. As to manufacture laminate, a sheet of fiber glass cloth is impregnated with the composition, and then is heated and dried to be prepreg; the prepreg is covered with copper foil on one or both sides, and some are laminated and heated under pressure to obtain a copper foil substrate.

Curing temperature for the epoxy resin varnish composition according to the present invention can be 30 to 300° C., preferably 150 to 210° C. If curing temperature is too low, curing rate is too slow that curing time has to be prolonged and it is ineffective for production; on the other hand, if curing temperature is too high, resin tends to be degraded, and curing rate is too fast to control. With the addition of NPBX to the composition, the cost is reduced; with the addition of phenolic curing agent to the composition, the reaction temperature is lowered and curing is promoted to completion, so that substrate Tg and other properties are improved.

EXAMPLE

The explanation is descried in detail in the present invention by the following preferred embodiments. Designations and ingredients thereof used in the Examples and Comparative Examples are listed as below.

Epoxy resin A: Phosphorus-containing epoxy resin manufactured by Nan Ya Plastics Corporation; trade name: NPEP-200LA70, epoxy equivalent: 340~380 g/eq, phosphorus content: 2.6%.

Epoxy resin B: Phosphorus-containing epoxy resin manufactured by Nan Ya Plastics Corporation; trade name: NLEP-204A70, epoxy equivalent: 440~480 g/eq, phosphorus content: 4%.

Epoxy resin C: Bromine-containing epoxy resin manufactured by Nan Ya Plastics Corporation; trade name: NPEB-454A80, epoxy equivalent: 420~455 g/eq, bromine content: 19%.

Epoxy resin D: Bromine-containing epoxy resin manufactured by Nan Ya Plastics Corporation; trade name: NPEB-485A80, epoxy equivalent: 385~405 g/eq, bromine content: 19%.

Curing agent A: Dicyanamide (DICY), 14.7% in DMF.

Curing agent B: Novolac resin manufactured by Nan Ya Plastics Corporation; trade name: BPA-PN.

Curing agent C: Tetraphenol ethane resin manufactured by Nan Ya Plastics Corporation; trade name: TPN.

Promoter 2MI: 2-Methyl imidazole, 14.2% in DMF.

Examples 1-8

Phosphorus-containing epoxy resin, NPBX and curing agent were used at various ratio, and inorganic fillers (Al(OH)$_3$ and SiO$_2$) and curing promoter were added, as described in Table 1; then varnish resin compositions at 65 solid % were obtained by adjusting with acetone. Laminate plates were prepared by conventional process, wherein a sheet of 7628 fiber glass cloth was impregnated with the above varnish resin solution and was dried at 170° C. (impregnator temperature) for several minutes. Molten viscosity of dried prepreg was adjusted to 4000~10000 poises by controlling drying time, and 8 films made therefrom were laminated between 2 sheets of copper foils each with thickness of 35 μm under the pressure of 25 kg/cm$^2$. Temperature raising was controlled as below. Thus, a laminate plate was obtained after hot press.

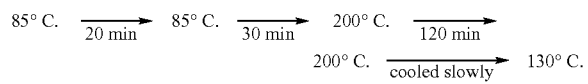

The obtained copper foil substrates were 1.6 mm in thickness.

Comparative Examples 1-2

Phosphorus-containing epoxy resin and curing agent but no NPBX were used at various ratio, and inorganic fillers (Al(OH)$_3$ and SiO$_2$) and curing promoter were added; then varnish resin compositions at 65 solid % were obtained by adjusting with acetone. Laminate plates were prepared in the same manner as Examples 1-8.

Examples 9-16

Brominated epoxy resin, NPBX and curing agent were used at various ratio, and curing promoter was added, as described in Table 2; then varnish resin compositions at 65 solid % were obtained by adjusting with acetone. Laminate plates were prepared in the same manner as Examples 1-8.

Comparative Examples 3-4

Brominated epoxy resin and curing agent but no NPBX were used at various ratio, and curing promoter was added; then varnish resin compositions at 65 solid % were obtained by adjusting with acetone. Laminate plates were prepared in the same manner as Examples 1-8.

Measurements

1. Varnish Gel Time (VGT)

Varnish solutions were made by mixing epoxy resin solution and various curing agents and promoters, then 0.3 ml of varnish solution was dropped on heat plate at 170° C. to measure gel time.

2. Water Absorption

Etched substrates were cut into square sheet of 5 cm$^2$ and baked in oven at 105° C. for 2 hours. Sample was put into pressure cooker under condition of 2 atm×120° C. for 30 minutes. Weight difference of the sample before and after pressure cooker processing was divided by initial weight to calculate water absorption.

3. 288° C. Solder Heat Resistance

Sample processed in pressure cooker as above was immersed into solder furnace at 288° C. to measure delamination time due to sample explosion.

TABLE 1

Compositional Percentage of Phosphor-containing Epoxy Resin Varnishes Made by Stirring at Normal (Room) Temperature

|  | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Epoxy resin A | 58 | 54 | 57 | 58 |  |  |  |  | 97 |  |
| Epoxy resin B |  |  |  |  | 41 | 39 | 37 | 38 |  | 79 |
| NPBX-610 | 26 |  |  |  | 47 |  |  |  |  |  |
| NPBX-620 |  | 30 |  |  |  | 47 |  |  |  |  |
| NPBX-630 |  |  | 26 |  |  |  | 50 |  |  |  |
| NPBX-640 |  |  |  | 28 |  |  |  | 45 |  |  |
| Curing agent A |  |  |  |  |  |  |  |  | 3 |  |
| Curing agent B | 16 |  | 17 |  |  |  | 13 |  |  | 21 |
| Curing agent C |  | 16 |  | 14 | 12 | 14 |  | 17 |  |  |
| Filler SiO2/ATH | 30 | 30 | 30 | 30 | 30 | 30 | 30 | 30 | 30 | 30 |
| Promoter 2MI(PHR) | 0.11 | 0.08 | 0.06 | 0.1 | 0.1 | 0.08 | 0.07 | 0.07 | 0.05 | 0.08 |

TABLE 2

Compositional Percentage of Bromine-containing Epoxy Resin Varnishes Made by Stirring at Normal (Room) Temperature

| | Example 9 | Example 10 | Example 11 | Example 12 | Example 13 | Example 14 | Example 15 | Example 16 | Comparative Example 3 | Comparative Example 4 |
|---|---|---|---|---|---|---|---|---|---|---|
| Epoxy resin C | 53 | 50 | 49 | 50 | | | | | 97 | |
| Epoxy resin D | | | | | 46 | 44 | 45 | 47 | | 78 |
| NPBX-610 | 31 | | | | 38 | | | | | |
| NPBX-620 | | 33 | | | | 44 | | | | |
| NPBX-630 | | | 37 | | | | 42 | | | |
| NPBX-640 | | | | 35 | | | | 39 | | |
| Curing agent A | | | | | | | | | 3 | |
| Curing agent B | 16 | | 14 | | | 12 | | | | 22 |
| Curing agent C | | 17 | | 15 | 16 | | 13 | 14 | | |
| Promoter 2MI(PHR) | 0.06 | 0.07 | 0.05 | 0.06 | 0.09 | 0.05 | 0.04 | 0.06 | 0.08 | 0.1 |

TABLE 3

Evaluation on Substrates Made of Various Compositions

| Item | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Varnish gel time, sec*[1] | 320 | 330 | 350 | 300 | 380 | 290 | 330 | 340 | 310 | 340 |
| Glass transition temp, °C.*[2] | 170 | 182 | 173 | 186 | 192 | 189 | 182 | 195 | 150 | 153 |
| Water absorption, %*[3] | 0.21 | 0.19 | 0.15 | 0.20 | 0.21 | 0.18 | 0.17 | 0.16 | 0.30 | 0.28 |
| Solder heat resistance, sec*[4] | 400 | 600 | 450 | 500 | 400 | 460 | 480 | 590 | 380 | 390 |
| Fire retardance (UL-94) | V-0 | V-0 | V-0 | V-0 | V-0 | V-0 | V-0 | V-0 | V-0 | V-0 |

Note:
*[1] 0.3 ml of varnish resin was dropped on heat plate at 170° C. to measure gel time.
*[2] Differential scanning calorimeter (DSC) was used with temperature raising rate = 20° C./min.
*[3] Sample was heated at 120° C. under 2 atm in pressure cooker for 30 minutes.
*[4] Sample was heated at 120° C. under 2 atm in pressure cooker for 30 minutes, and immersed into solder furnace at 288° C. to measure delamination time due to sample explosion.

TABLE 4

Evaluation on Substrates Made of Various Compositions

| Item | Example 9 | Example 10 | Example 11 | Example 12 | Example 13 | Example 14 | Example 15 | Example 16 | Comparative Example 3 | Comparative Example 4 |
|---|---|---|---|---|---|---|---|---|---|---|
| Varnish gel time, sec*[1] | 310 | 320 | 340 | 295 | 320 | 295 | 310 | 330 | 320 | 310 |
| Glass transition temp, °C.*[2] | 165 | 173 | 168 | 176 | 177 | 182 | 180 | 179 | 149 | 151 |
| Water absorption, %*[3] | 0.20 | 0.21 | 0.19 | 0.22 | 0.16 | 0.17 | 0.19 | 0.19 | 0.28 | 0.30 |
| Solder heat resistance, sec*[4] | 600 | 560 | 500 | 600 | 500 | 600 | 520 | 590 | 400 | 500 |
| Fire retardance (UL-94) | V-0 | V-0 | V-0 | V-0 | V-0 | V-0 | V-0 | V-0 | VV-0 | V-0 |

Note:
*[1] 0.3 ml of varnish resin was dropped on heat plate at 170° C. to measure gel time.
*[2] Differential scanning calorimeter (DSC) was used with temperature raising rate = 20° C./min.
*[3] Sample was heated at 120° C. under 2 atm in pressure cooker for 30 minutes.
*[4] Sample was heated at 120° C. under 2 atm in pressure cooker for 30 minutes, and immersed into solder furnace at 288° C. to measure delamination time due to sample explosion.

The result of substrate test is shown in Table 3. The halo-free resin compositions in the present invention are qualified for UL94 V-0 Flammability Test and improve other properties of substrate with phosphor content being low. Also, the halo-containing resin compositions as shown in Table 4 are qualified for UL94 V-0 Flammability Test and improve other properties of substrate with bromine content being low. Therefore, the present resin compositions added with NPBX thermosetting resin in the present invention is of low cost. Further, lower curing temperature, higher resin crosslinking density and improvement on substrate properties are achieved by adding novolac resin curing agent.

What we claimed is:

1. An epoxy resin varnish composition with high glass transition temperature for laminate, which is admixed with dihydrobenzoxazine thermosetting resin, comprising: (A) 20~70 wt % of dihydrobenzoxazine thermosetting resin, (B) 30~70 wt % of one or more epoxy resins, (C) a novolac resin curing agent, and (D) a curing promoter, wherein the (A) dihydrobenzoxazine thermosetting resin has the following formula:

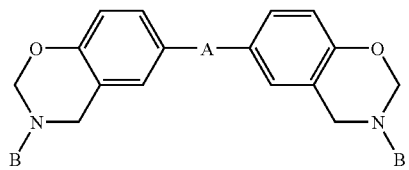

wherein A represents the following formula:

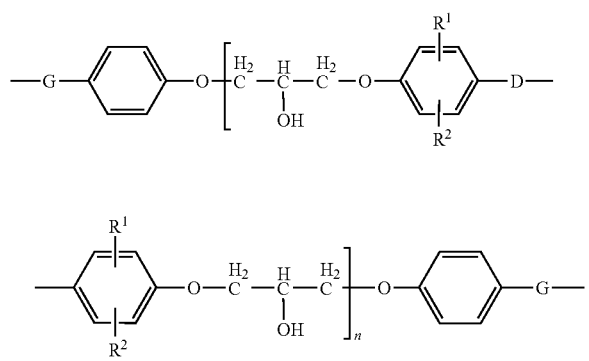

G represents

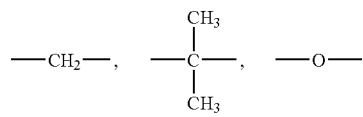

D represents

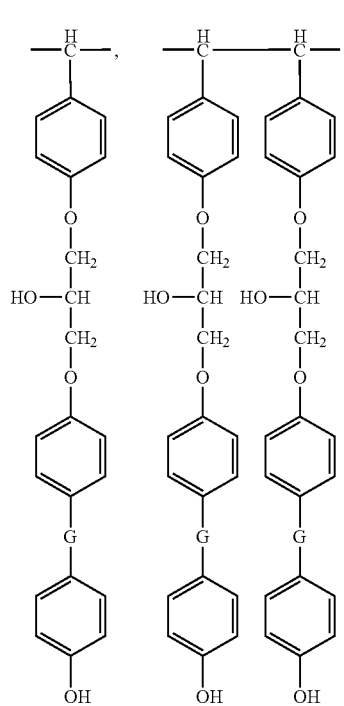

$R^1$ and $R^2$ each independently represents H, $CH_3$ or Br; and B represents amines or diamines.

2. The varnish composition according to claim 1, wherein the (A) dihydrobenzoxazine thermosetting resin is obtained by reacting compounds (a) phenolic products obtained from the reaction of di- or multifunctional epoxy resin and di-functional phenolic compounds; (b) mono- or di-functional primary amines; (c) di-functional phenols; and (d) formaldehyde or paraformaldehyde, in the presence of a solvent.

3. The varnish composition according to claim 2, wherein the (a) phenolic product is obtained from the reaction of the di- or multifunctional epoxy resin and the di-functional phenolic compounds, with content of 5~40 wt % and having the following formula:

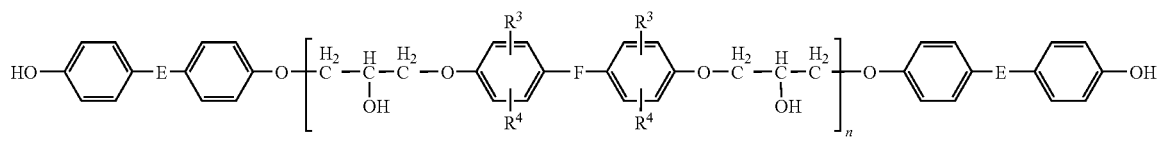

wherein F represents

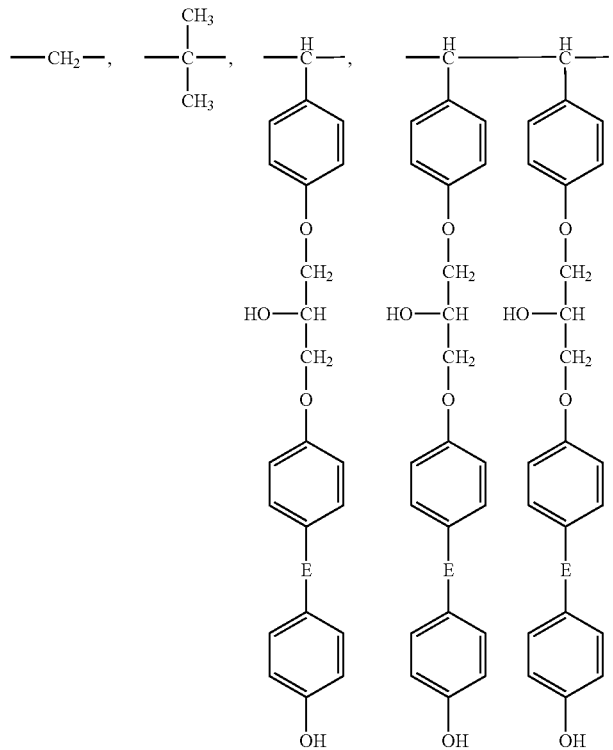

E represents

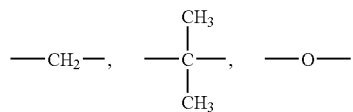

and $R^3$ and $R^4$ each independently represents H, $CH_3$ or Br.

4. The varnish composition according to claim 2, wherein the (b) mono- or di-functional primary amine has a content of 20~40 wt %.

5. The varnish composition according to claim 2, wherein the (c) di-functional phenol has a content of 15~70 wt %.

6. The varnish composition according to claim 2, wherein the (d) formaldehyde or paraformaldehyde has a content of 10~30 wt %.

7. The varnish composition according to claim 2, wherein the solvent is selected from the group consisting of alcohols, ketones, ethers, esters, and hydrocarbons.

8. The varnish composition according to claim 1, wherein the (B) one or more epoxy resins comprises a phosphorus-containing epoxy resin in which epoxy equivalent is 350~480 g/eq and having a phosphorus content of 2~5 wt %.

9. The varnish composition according to claim 1, wherein the (B) one or more epoxy resins comprises a phosphorus-containing epoxy resin in which epoxy equivalent is 340~460 g/eq with a phosphorus content of 2~5 wt %, wherein the phosphorus-containing epoxy resin is prepared from a phosphine compound.

10. The varnish composition according to claim 1, wherein the (B) one or more epoxy resins comprises a bromine-containing epoxy resin obtained by reacting tetrabromobisphenol A (TBBA) and liquid epoxy resin and having a bromine content of 14~25 wt %.

11. The varnish composition according to claim 1, wherein the (C) novolac resin curing agent is selected from the group consisting of phenol novolac resin (PN), melamine phenol novolac (MPN), BPA phenol novolac (BPA-PN), and tetraphenol ethane resin (TPN), wherein the (C) novolac resin curing agent is at 1~20 wt % of the composition.

12. The varnish composition according to claim 1, wherein the (D) curing promoter is selected from the group consisting of benzyldimethyl amine, 2-methyl imidazole (2MI), 2-phenyl imidazole, and 2-ethyl-4-methyl imidazole (2E4MZ), and wherein the (D) curing promoter comprises 0.01~1 PHR of the total amount of resin.

13. The varnish composition according to claim 1, further comprising an inorganic filler, selected from the group consisting of Al(OH)$_3$, SiO$_2$, clay, titanium dioxide, barium titanate, and strontium titanate.

14. The varnish composition according to claim 1, further comprising a solvent for adjusting viscosity selected from the group consisting of acetone, methyl ethyl ketone, 1-methoxy-2-propanol (PM), isopropanol (IPA), or N,N-dimethylformamide (DMF).

15. The varnish composition according to claim 1, wherein said composition can be used for multilayer laminates, composite materials, printed circuit boards, inks, or packaging materials.

16. The varnish composition according to claim 1, wherein the (C) novolac resin curing agent is tetraphenol ethane resin at 5~30 wt % of the composition.

17. The varnish composition according to claim 13, wherein the inorganic filler is at 30~50 wt % of the composition.

18. The varnish composition according to claim 1, wherein the (B) one or more epoxy resins are selected from the group consisting of phosphorus-containing epoxy resin and bromine-containing epoxy resin.

* * * * *